United States Patent [19]
Aklufi

[11] Patent Number: 5,510,088
[45] Date of Patent: Apr. 23, 1996

[54] LOW TEMPERATURE PLASMA FILM DEPOSITION USING DIELECTRIC CHAMBER AS SOURCE MATERIAL

[75] Inventor: Monti E. Aklufi, San Diego, Calif.

[73] Assignee: The United States of America as represented by the Secretary of the Navy, Washington, D.C.

[21] Appl. No.: 897,173

[22] Filed: Jun. 11, 1992

[51] Int. Cl.⁶ ........................... C23C 14/34; C23C 16/22
[52] U.S. Cl. ............... 422/186.05; 204/192.15; 204/298.02; 204/298.07; 427/575
[58] Field of Search ............. 422/186.05; 204/157.43, 204/157.44, 192.1, 298.02, 298.07, 192.15, 298.01; 427/575

[56] References Cited

U.S. PATENT DOCUMENTS

| | | |
|---|---|---|
| 4,268,711 | 5/1981 | Gurev . |
| 4,339,326 | 7/1982 | Hirose et al. ........................ 204/298 |
| 4,492,620 | 1/1985 | Matsuo et al. . |
| 4,522,674 | 6/1985 | Ninomiya et al. ................... 156/345 |
| 4,686,113 | 8/1987 | Delfino et al. ...................... 427/45.1 |
| 4,715,937 | 12/1987 | Moslehi et al. ..................... 204/177 |
| 4,732,761 | 3/1988 | Machida et al. . |
| 4,916,091 | 4/1990 | Freeman et al. . |
| 4,941,915 | 7/1990 | Matsuoka et al. ................. 204/298.12 |
| 4,943,345 | 7/1990 | Asmussen et al. ................. 156/643 |
| 5,023,056 | 6/1991 | Aklufi et al. . |
| 5,069,770 | 12/1991 | Glocker et al. ................... 204/192.12 |
| 5,082,545 | 1/1992 | Tanaka et al. ................... 204/298.03 |

OTHER PUBLICATIONS

Hanak et al., "Effect of secondary electrons and negative ions on sputtering of films", *J. Vac. Sci. Technol.*, vol. 13, No. 1, Jan./Feb. 1976, pp. 406–409.

Vossen, "Inhibition of chemical sputtering of organics and C by trace amounts of Cu surface contamination", *Journal of Applied Physics*, vol. 47, No. 2, Feb. 1976, pp. 544–546.

Holland, "Some characteristics and uses of low pressure plasmas in materials science", *J. Vac. Sci. Technol.*, vol. 14, No. 1, Jan./Feb. 1977, pp. 5–15.

*Primary Examiner*—Donald P. Walsh
*Assistant Examiner*—Daniel Jenkins
*Attorney, Agent, or Firm*—Harvey Fendelman; Thomas Glenn Keough; Peter A. Lipovsky

[57] ABSTRACT

A chemical vapor deposition system utilizes a microwave carrying dielectric member and inner chamber that are both placed within a reaction chamber. The inner chamber is used as a semiconductor source material, which in one particular embodiment is reactive with atomic hydrogen to form volatile hydrides or other gaseous compounds which react to form a desired film composition. The invention is useful for, but not limited to, submicron dimension integrated circuit fabrication, in particular, low temperature, cold wall reactor environments. By constraining the semiconductor production reaction between the inner chamber source material and an integrated circuit substrate, particulate formation is minimized, thereby reducing integrated circuit particle yield losses.

53 Claims, 1 Drawing Sheet

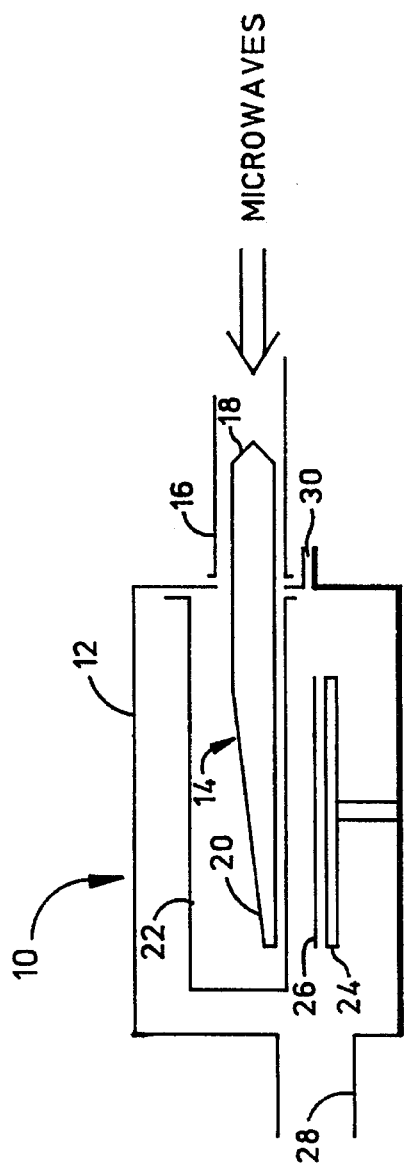
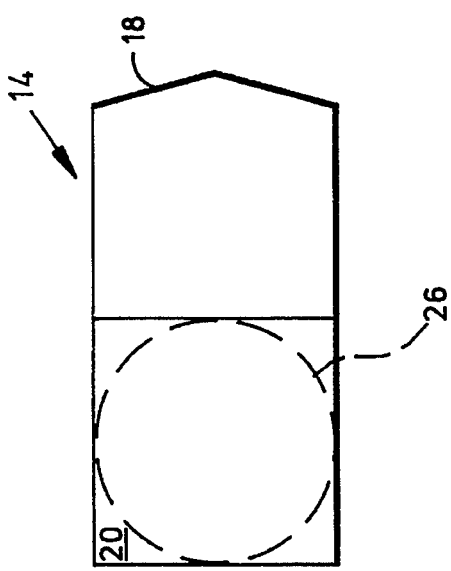

5,510,088

LOW TEMPERATURE PLASMA FILM DEPOSITION USING DIELECTRIC CHAMBER AS SOURCE MATERIAL

STATEMENT OF GOVERNMENT INTEREST

The invention described herein may be manufactured and used by or for the Government of the United States of America for governmental purposes without the payment of any royalties thereon or therefor.

DOCUMENTS INCORPORATED BY REFERENCE

U.S. Pat. No. 5,023,056 issued on Jun. 11, 1991 to inventors Monti E. Aklufi and David W. Brock for an invention titled "PLASMA GENERATOR UTILIZING DIELECTRIC MEMBER FOR CARRYING MICROWAVE ENERGY" is hereby incorporated herein with all its appertaining documents and references. Also incorporated by reference is Vossen, J. L. & Kern, W. *Thin Film Processes,* Academic Press, NY.

BACKGROUND OF THE INVENTION

1. Field of the Invention

This invention pertains broadly to the field of plasma generating devices such as those used in the semiconductor processing industry. More particularly, but without limitation thereto, the invention relates to a highly controlled, low temperature, semiconductor processing method/system in which particulate formation is minimized.

2. Description of the Related Art

In the integrated circuit fabrication art, yield losses have been attributed to particulate induced defects. As circuit feature sizes are continually reduced, particularly into the submicron range, particulates have become one of the primary sources of yield losses. To maintain submicron dimensions during device fabrication, low temperature deposition of dielectric films in cold wall reactors has become a common processing step. Yet, a drawback of cold wall depositions is the potential for particle formation.

In the United States Patent referenced above an invention is described that uses a dielectric member for carrying microwave energy into a semiconductor process reaction chamber. By "carrying" microwave energy to a specific preselected location within semiconductor processing equipment, a plasma formed from the energy is more highly controlled, thereby permitting greater uniformity in semiconductor production.

Those in the semiconductor industry know that plasmas are used to facilitate the deposition of selected materials upon semiconductor substrates as well as to etch or remove selected materials from various surfaces.

In the past, plasmas have been formed by coupling radio frequency energy to a gas by way of electrodes, coils or plates or by coupling microwave energy to a gas by way of a hollow waveguide and a resonant cavity. Generally speaking, plasma formation by way of these two techniques has not been as controlled as desired. Though good results have been achieved, those skilled in the art know that if a greater degree of plasma control could be attained, superior semiconductor production will be achieved.

In the referenced patented invention, a high degree of plasma control was made possible by using a dielectric member to carry microwave energy to a specific location within a processing reactor. In one embodiment of the described invention, an inner chamber was placed around the microwave carrying dielectric member and then both of these were inserted into a semiconductor reaction chamber. Though the interior of the reaction chamber was placed under a vacuum, the pressure within the inner chamber surrounding the dielectric member was kept at atmospheric pressure. This prevented plasma from forming directly about the member and caused a plasma to be formed in a controlled manner about the periphery of the inner chamber. To further control plasma formation, the dielectric member could be tapered so that microwave emission occurs at the member's tapered end, and the dielectric member could be tilted within the inner chamber so that plasma formation occurs in an area where the tilted dielectric member and inner chamber are closest.

In order to meet the submicron dimensional requirements of today's integrated circuit technology, an improvement of the described patented invention was derived.

SUMMARY OF THE INVENTION

The invention utilizes a microwave carrying dielectric member and optionally, an inner chamber such as those described in cited U.S. Pat. No. 5,023,056. This invention has application to submicron-dimension integrated circuit fabrication. Use of the invention is preferred in low temperature (approximately 200° C.), cold wall (non-externally heated) reactor environments. The invention does, however, also have application to hot wall (externally heated) reactor conditions.

The invention described uses the inner chamber as a semiconductor source material, which in a particular embodiment is reactive with atomic hydrogen to form volatile hydrides or other gaseous compounds which react to form a desired film composition. By constraining the semiconductor production reaction between the inner chamber source material and an integrated circuit substrate, particulate formation is minimized, thereby reducing integrated circuit particle yield losses.

For those plasma deposition systems that do not utilize an inner chamber, any wall sufficiently close to the generated plasma may be used as a deposition source material. In such a case it is only necessary that the wall react with atomic hydrogen so as to ultimately form the desired film composition. Where deposition on a substrate is desired, the hydrogen gas should be introduced between the reactive wall and the substrate.

OBJECTS OF THE INVENTION

It is an object of this invention to provide an improved plasma generating apparatus.

Another object of this invention is to provide an improved plasma generator for semiconductor processing.

Yet a further object of this invention is to provide an improved plasma generating device that permits a generated plasma to be highly controlled.

Another object of this invention is to provide an improved plasma generator that avoids the formation of particulates during film deposition to thereby reduce integrated circuit yield losses.

Other objects, advantages and new features of the invention will become apparent from the following detailed description of the invention when considered in conjunction with the accompanied drawings.

BRIEF DESCRIPTION OF THE DRAWINGS

FIG. 1 is a diagrammatic representation of a portion of a plasma generating system according to a representative embodiment of the invention.

FIG. 2 is a top view showing a portion of the system of FIG. 1.

DESCRIPTION OF THE PREFERRED EMBODIMENT

Referring to FIG. 1, a diagrammatic view of a chemical vapor deposition system 10 according to a representative embodiment of the invention is shown. System 10 includes a reaction chamber 12 which may be cold walled or heated depending upon the deposition environment desired. Microwaves are carried directly into reaction chamber 12 by way of a dielectric member 14 described in the referenced patent.

The microwave energy is supplied to chamber 12 by a conventional microwave source such as one incorporating a traveling wave tube. The microwaves are transported from this source to dielectric member 14 through a transitioning hollow metal waveguide 16. Dielectric member 14 originates preferably with an acute tapered shape 18 within waveguide 16 and terminates within reaction chamber 12 with preferably an elongated tapered shape 20. Enclosing dielectric member 14 within reaction chamber 12 is an inner chamber 22. Inner chamber 22 serves as a source material for the desired deposition reaction as will be further explained. For example, inner chamber 22 may be made of high purity, clear, fused silica (silicon dioxide) to provide this material to the reaction process.

Also located within reaction chamber 12 is a platen 24 upon which a substrate 26 or multiple substrates may be disposed. The substrate, such as silicon, is placed to be located beneath elongated tapered section 20 of dielectric member 14.

In FIG. 2 a top view shows the relationship of substrate 26 and dielectric waveguide 14.

As shown in FIG. 1, dielectric waveguide 14 is placed within inner chamber 22 so that it is physically closer to the substrate side of chamber 22. Besides rotating substrate 26, heating features could be provided to reaction chamber 12 so that the substrate could be heated as well as physically moved. The distance between the substrate 26 and inner chamber 22 will in part determine among other things the rate at which a dielectric film may be deposited.

After a substrate has been placed within chamber 12, chamber 12 is evacuated through vacuum port 28, preferably to a pressure less than 1 microtorr. The interior of inner chamber 22 is maintained at atmospheric pressure. A plasma producing gas, such as argon gas, may be introduced into reaction chamber 12 from input port 30 to increase pressure within the chamber by a desired amount, preferably 0.5 torr or greater. Microwave power is then used to initiate and sustain a plasma from the argon gas that becomes located between inner chamber 22 and substrate 26.

If one desired to initiate the deposition of silicon dioxide, for example, the reactive gas hydrogen will be used and introduced into the reaction chamber through gas input port 30. To obtain an Si/O ratio of 0.5 (SiO2), the reactive gas oxygen is introduced into reaction chamber 12 through port 28 at a flow rate of at least 4 percent of the hydrogen gas flow rate.

The argon initiated plasma will cause molecular hydrogen (H2) to dissociate into atomic hydrogen as may be represented by equation (1). The atomic hydrogen that is formed may reside in a number of different activated atomic states.

In the invention the strongest electric field and hence the highest density plasma will occur where the microwaves emanate from the dielectric waveguide's elongated tapered shape 20. It is in this region that the atomic hydrogen will readily form and react with the outside surface of the silicon dioxide inner chamber to form silane (SiH4) and water vapor (H2O). This reaction may be represented by equation (2). The silane formed can be dissociated by microwaves, plasma, and microwave induced ultraviolet radiation into lower form hydrides such as SiH, SiH2, and SiH3 as may be represented by equation (3). Silane, see equation (4), or its lower form hydrides, will react at the substrate surface to form solid silicon dioxide and gaseous hydrogen.

The precise nature of the reaction of inner chamber 22 with deposition constituents is not known. However, at least part of this reaction is considered due to what is known as "chemical sputtering" described in the Vosser reference cited above.

$$H_2 \rightarrow 2H \qquad \text{eq. (1)}$$

$$8H + SiO_2 \rightarrow SiH_4 + 2H_2O \qquad \text{eq. (2)}$$

$$3SiH_4 \rightarrow SiH + SiH_2 + SiH_3 + 3H_2 \qquad \text{eq. (3)}$$

$$SiH_4 + 2H_2O \rightarrow SiO_2 + 4H_2 \qquad \text{eq. (4)}$$

Those skilled in the art will realize that other dielectrics could be deposited in a similar manner. The only requirements are that any wall or chamber sufficiently exposed to a generated plasma be of the source material desired and that the wall react with atomic hydrogen to form volatile hydrides or gaseous compounds which would then react to form desired film compositions. Of course additional gasses may also be added to change the composition of the deposited films. For example, the exposed wall may be made of silicon nitride, Si3N4. Oxygen, O2, may be added to form an oxynitride film, SixNyOz, where x, y and z are any small numbers. The gas combination of hydrogen and nitrous oxide could also be used in the process of the invention.

Obviously, many modifications and variations of the invention are possible in light of the above teachings. It is therefore to be understood that within the scope of the appended claims the invention may be practiced otherwise than as has been specifically described.

What is claimed is:

1. A method using plasma to form a thin film within a reaction vessel, said method including the steps of:

generating a plasma within said reaction vessel, said reaction vessel containing an inner chamber of a material desired to be made a part of said thin film; and introducing a reactive gas into said reaction vessel, said reactive gas reacting with said inner chamber so that said thin film results at least in part from said reaction.

2. A method according to claim 1 in which said reactive gas includes hydrogen gas.

3. A method according to claim 1 in which said reactive gas includes hydrogen and oxygen.

4. A method according to claim 1 in which said reactive gas includes hydrogen and nitrous oxide.

5. A method according to claim 1 in which said inner chamber includes silicon dioxide.

6. A method according to claim 5 in which said reactive gas includes hydrogen and oxygen.

7. A method according to claim 1 in which said inner chamber includes silicon nitride.

8. A method according to claim 7 in which said reactive gas includes hydrogen and oxygen.

9. A method according to claim 1 in which said reaction vessel is a cold wall vessel.

10. A method according to claim 1 in which said reaction vessel is a hot wall vessel.

11. A method according to claim 1 in which said plasma is an argon plasma.

12. A method according to claim 1 in which said inner chamber is a dielectric.

13. A method according to claim 12 in which said argon plasma is generated by way of microwave energy.

14. A method according to claim 1 in which said thin film is formed at approximately 200 degrees Celsius.

15. A method according to claim 1 in which said reaction of said reaction vessel with said reactive gas is at least in part due to chemical sputtering.

16. A method according to claim 1 in which said reactive gas at least partially chemically reacts with said inner chamber.

17. A method according to claim 16 in which said inner chamber is electrically unbiased.

18. A method according to claim 17 in which said reactive gas includes hydrogen gas.

19. A method according to claim 17 in which said reactive gas includes hydrogen and oxygen.

20. A method according to claim 17 in which said reactive gas includes hydrogen and nitrous oxide.

21. A method according to claim 17 in which said inner chamber includes silicon dioxide.

22. A method according to claim 21 in which said reactive gas includes hydrogen and oxygen.

23. A method according to claim 17 in which said inner chamber includes silicon nitride.

24. A method according to claim 23 in which said reactive gas includes hydrogen and oxygen.

25. A method according to claim 17 in which said reaction vessel is a cold wall vessel.

26. A method according to claim 17 in which said reaction vessel is a hot wall vessel.

27. A method according to claim 17 in which said plasma is an argon plasma.

28. A method according to claim 17 in which said inner chamber is a dielectric.

29. A method according to claim 28 in which said argon plasma is generated by way of microwave energy.

30. A method according to claim 17 in which said thin film is formed at approximately 200 degrees Celsius.

31. A method for generating a thin film from an apparatus including a nonconductive member for carrying electromagnetic energy and for emitting said electromagnetic energy;

a substantially electromagnetically transparent inner chamber enclosing said nonconductive member, said inner chamber including a material desired to be a part of said thin film; and an outer reaction chamber enclosing said inner chamber, said reaction chamber defining a reaction chamber volume, the method comprising the steps of:

evacuating said reaction chamber volume to a pressure less than atmospheric pressure;

introducing a plasma producing gas into said reaction chamber volume;

establishing a source of electromagnetic energy;

carrying said electromagnetic energy in said dielectric member and emitting said electromagnetic energy from said dielectric member to generate a plasma from said plasma producing gas, said plasma being confined to the outside surface of said inner chamber; and introducing a reactive gas into said reaction chamber volume, said reactive gas including one or more elements desired to be made a part of said thin film, in which said plasma causes said reactive gas to react with said inner chamber to produce said thin film.

32. A method according to claim 31 in which said reaction of said inner chamber with said reactive gas is at least in part due to chemical sputtering.

33. A method of claim 31 further including the step of placing a substrate within said reaction chamber volume so that said thin film is deposited on said substrate.

34. A method of claim 31 in which said inner chamber provides silicon dioxide as a thin film material.

35. A method of claim 34 in which said reactive gas includes hydrogen and oxygen.

36. A method of claim 31 in which said inner chamber provides silicon nitride as a thin film material.

37. A method of claim 36 in which said reactive gas includes hydrogen and oxygen.

38. A method of claim 31 in which said plasma producing gas includes argon.

39. A method according to claim 31 in which said nonconductive member is a dielectric.

40. A method of claim 34 in which said electromagnetic energy is microwave energy.

41. A method of claim 31 in which said reactive gas includes hydrogen.

42. A method of claim 31 in which said reactive gas includes hydrogen and oxygen.

43. A method of claim 31 in which said reactive gas includes hydrogen and nitrous oxide.

44. A method according to claim 31 in which said reaction chamber is a cold wall reaction chamber.

45. A method according to claim 31 in which said reaction chamber is a hot wall reaction chamber.

46. A method according to claim 15 in which said thin film is formed at a low temperature of approximately 200 degrees Celsius.

47. A method according to claim 31 in which said inner chamber defines an inner chamber volume that is maintained at substantially atmospheric pressure.

48. A method for generating a silicon dioxide thin film on a substrate from an apparatus including a nonconductive dielectric member for carrying microwave energy and for emitting said microwave energy;

a substantially electromagnetically transparent inner chamber enclosing said nonconductive member, said inner chamber defining an inner chamber volume and being made of silicon dioxide; and an outer low temperature, cold wall reaction chamber enclosing said inner chamber, said reaction chamber defining a reaction chamber volume;

the method comprising the steps of:

placing a substrate within said reaction chamber volume;

evacuating said reaction chamber volume to a pressure less than atmospheric pressure;

maintaining said inner chamber at atmospheric pressure;

introducing a plasma producing argon gas into said reaction chamber volume;

establishing a source of microwave energy;

carrying said microwave energy in said dielectric member and emitting said microwave energy from said dielectric member to generate a plasma from said plasma producing argon gas, said plasma being confined to the outside surface of said inner chamber; and introducing a reactive gas into said reaction chamber volume, said reactive gas including hydrogen and oxygen, in which said plasma causes said reactive gas to react with said silicon dioxide inner chamber to produce said silicon dioxide thin film on said substrate.

49. A method according to claim 48 in which said reaction of said inner chamber with said reactive gas is at least in part due to chemical sputtering.

50. A method according to claim 48 in which silane is formed from said reaction of said silicon dioxide inner chamber and said reactive gas.

51. A method according to claim 50 in which said silane is disassociated by microwaves.

52. A method according to claim 50 in which said silane is disassociated by plasma.

53. A method according to claim 50 in which said silane is disassociated by microwave induced ultraviolet radiation.

* * * * *